United States Patent
Bardsley

(10) Patent No.: US 6,894,631 B1
(45) Date of Patent: May 17, 2005

(54) PIPELINE ADC DIGITAL DITHERING FOR INCREASED DIGITAL CALIBRATION RESOLUTION

(75) Inventor: Scott Gregory Bardsley, Summerfiled, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/814,661

(22) Filed: Mar. 31, 2004

(51) Int. Cl.[7] ............................................. H03M 1/10
(52) U.S. Cl. ...................................... 341/120; 341/118
(58) Field of Search ................................ 341/118, 120, 341/131, 143, 155, 159, 161

(56) References Cited

U.S. PATENT DOCUMENTS

| | | |
|---|---|---|
| 4,814,767 A | 3/1989 | Fernandes et al. |
| 5,043,732 A | 8/1991 | Robertson et al. |
| 5,499,027 A | 3/1996 | Karanicolas et al. |
| 5,510,789 A | 4/1996 | Lee |
| 5,668,549 A | 9/1997 | Opris et al. |
| 5,760,720 A | 6/1998 | Nolan et al. |
| 5,784,016 A | 7/1998 | Nagaraj |
| 5,821,810 A | 10/1998 | Swart et al. |
| 5,867,116 A | 2/1999 | Nakamura et al. |
| 5,929,796 A * | 7/1999 | Opris et al. .................. 341/120 |
| 5,977,894 A * | 11/1999 | McCarroll et al. .......... 341/120 |
| 6,150,968 A | 11/2000 | Tsay et al. |
| 6,184,809 B1 | 2/2001 | Yu |
| 6,232,898 B1 | 5/2001 | Nagaraj |
| 6,366,230 B1 | 4/2002 | Zhang et al. |
| 6,456,223 B1 * | 9/2002 | Yu et al. ...................... 341/161 |
| 6,472,897 B1 | 10/2002 | Shyr et al. |
| 6,486,807 B2 | 11/2002 | Jonsson |
| 6,489,904 B1 * | 12/2002 | Hisano ........................ 341/120 |
| 6,563,445 B1 | 5/2003 | Sabouri |
| 6,570,411 B1 | 5/2003 | Bardsley et al. |
| 6,606,042 B2 | 8/2003 | Sonkusale et al. |
| 6,784,814 B1 * | 8/2004 | Nair et al. ................... 341/118 |

* cited by examiner

Primary Examiner—Jean Jeanglaude
Assistant Examiner—Linh V Nguyen
(74) Attorney, Agent, or Firm—Wolf, Greenfield & Sacks, P.C.

(57) ABSTRACT

An pipeline analog-to-digital converter (ADC) is provided that is capable of applying calibration at a resolution greater than the resolution of a digital output signal provided by the ADC. The ADC includes a calibration component adapted to apply calibration bits to digital output bits generated by stages of the pipeline and corresponding to samples of an analog input signal. The ADC also includes a random number generator that provides at least one random bit having a sub-LSB bit weight. The calibration bits and the at least one random bit are applied as a dither to the digital output bits such that, on average, the digital output signal provided by the ADC is calibrated at a sub-LSB resolution.

19 Claims, 8 Drawing Sheets

|   | \multicolumn{4}{c|}{690a} | \multicolumn{2}{c}{690b} |
|---|---|---|---|---|---|---|
|   | 1 | 2 | 3 | 4 | 1 | 2 |
|   | \multicolumn{4}{c|}{Input to Correction Component} | \multicolumn{2}{c}{Digital Output} |
|   | \multicolumn{2}{c|}{Digital Output Bits} | Random Bits | Calibration | No Calibration | With Calibration |
|   | $2^2, 2^1, 2^0$ | $2^{-1}, 2^{-2}$ | $2^{-3}, 2^{-4}$ | $2^{-3}, 2^{-4}$ | $2^2, 2^1, 2^0$ | $2^2, 2^1, 2^0$ |
| 1 | 111 | 11 | 00 / 01 / 10 / 11 |   | 111 | 111 |
| 2 | 100 | 00 | 00 / 01 / 10 / 11 | 00 |   |   |
| 3 | 100 | 01 | 00 / 01 / 10 / 11 |   | 100 | 100 |
| 4 | 100 | 10 | 00 / 01 / 10 / 11 |   |   |   |
| 5 | 100 | 11 | 00 / 01 / 10 / 11 | 01 |   |   |
| 6 | 101 | 00 | 00 / 01 / 10 / 11 |   | 101 | 101 |

695

TRIM

| | Input to Correction Component | | | Digital Output | |
|---|---|---|---|---|---|
| | Digital Output Bits | | Random Bits | Calibration | No Calibration | With Calibration |
| | $2^2, 2^1, 2^0$ | $2^{-1}, 2^{-2}$ | $2^{-3}, 2^{-4}$ | $2^{-3}, 2^{-4}$ | $2^2, 2^1, 2^0$ | $2^2, 2^1, 2^0$ |
| 1 | 111 | 11 | 00 | | 111 | 111 |
| | | | 01 | | | |
| | | | 10 | | | |
| | | | 11 | | | |
| 2 | 100 | 00 | 00 | 01 | 100 | 100 |
| | | | 01 | | | |
| | | | 10 | | | |
| | | | 11 | | | |
| 3 | 100 | 01 | 00 | | | |
| | | | 01 | | | |
| | | | 10 | | | |
| | | | 11 | | | |
| 4 | 100 | 10 | 00 | 10 | | |
| | | | 01 | | | |
| | | | 10 | | | |
| | | | 11 | | | |
| 5 | 100 | 11 | 00 | | | |
| | | | 01 | | | |
| | | | 10 | | | |
| | | | 11 | | | |
| 6 | 101 | 00 | 00 | | 101 | 101 |
| | | | 01 | | | |
| | | | 10 | | | |
| | | | 11 | | | |

PIPELINE ADC DIGITAL DITHERING FOR INCREASED DIGITAL CALIBRATION RESOLUTION

FIELD OF THE INVENTION

The present invention relates generally to calibrating a multi-stage or pipeline analog-to-digital converter (ADC), and more particularly, to providing calibration at a resolution greater than the resolution of the digital output signal provided by the ADC.

BACKGROUND OF THE INVENTION

Many analog-to-digital converters (ADC) are implemented in a pipeline architecture. Multi-stage or pipeline ADC's comprise a plurality of stages that quantize samples of an analog input signal at successively refined resolutions. Generally, the first stage receives an analog signal to be digitized and both outputs some number of the most significant bits (MSB) of the digitized output, and provides a residue signal to the next stage in the pipeline. The residue signal is related to the difference between the digital output bits generated by each stage and the analog signal provided to each respective stage.

The residue signal indicates the quantization error of a stage and is provided as the input analog signal to a subsequent stage. The subsequent stage converts the residue signal into a number of the next most significant bits of the digitized output and provides a residue signal to the subsequent stage in the pipeline. This process is repeated until the final stage of the pipeline, operating on the residue of the previous stage, outputs the least significant bits of the digitized output. Accordingly, the digitized output (i.e., the digital representation of a sample of the analog input signal) typically includes digital output bits from each of the stages in the pipeline.

Pipeline architectures typically have relatively inexpensive hardware costs compared to other ADC implementations (e.g., by reducing the number of comparators required in other parallel architectures) and exhibit generally satisfactory throughput. However, speed, accuracy and resolution of the ADC may be limited by the pipeline architecture. In particular, the accuracy and resolution of a pipeline ADC may be effected by offset errors, gain errors, integral non-linearity (INL) errors, differential non-linearity (DNL) errors, etc. Various calibration techniques have been employed to correct for these errors. However, calibrating one or more of these errors at a resolution higher than the resolution of the digital output signal provided by the ADC often is problematic. For example, the resolution of an ADC (which is related to the number of bits provided by the ADC) is often limited by the number of pipeline stages arranged as described above that can provide additional digitized outputs that are correlated enough to the stage's input analog to provide further information. Accordingly, the digital output bits are often truncated at the last meaningful stage of the pipeline. However, errors in the pipeline may exist at resolutions higher than the resolution of the ADC. That is, errors may exist at smaller increments than can be described by the least significant bit provided by the pipeline, making such errors difficult to account for and correct.

SUMMARY OF THE INVENTION

One embodiment according to the present invention includes a method of performing a digital dither to provide a digital output signal in an analog-to-digital converter having a plurality of stages arranged in pipeline. The method comprises acts of generating a plurality of digital output bits from samples of an analog input signal, the plurality of digital output bits having associated bit weights including an LSB bit weight, generating at least one random bit having a sub-LSB bit weight, providing a plurality of calibration bits, at least one of the plurality of calibration bits having a sub-LSB bit weight, and applying the calibration bits to the plurality of digital output bits and at least one random bit to form the digital output signal.

Another embodiment according to the present invention includes an analog-to-digital converter (ADC) for providing a digital output signal indicative of an analog input signal, the ADC comprising a plurality of stages arranged in a pipeline, each of the plurality of stages providing at least one bit from samples of the analog input signal to form a plurality of digital output bits, at least one of the plurality of digital output bits having an LSB bit weight, a random bit generator adapted to generate at least one random bit having a sub-LSB bit weight, at least one register adapted to store a plurality of calibration bits, at least one of the plurality of calibration bits having a sub-LSB bit weight, and a correction component arranged to receive at least some of the plurality of digital output bits, the plurality of calibration bits and the at least one random bit, the correction component configured to modify the plurality of digital output bits according to the calibration bits and the at least one random bit to form the digital output signal.

Another embodiment according to the present invention includes a digital signal generated by a pipeline ADC and representing samples of an analog input signal, the digital signal comprising M bits having associated bit weights $2^{M-1}$ through $2^0$, respectively, wherein a value of at least a bit having associated bit weight $2^0$ is determined by adding together digital output bits provided by the pipeline, a plurality of calibration bits having at least one bit with a sub-LSB bit weight, and at least one random bit having a sub-LSB bit weight.

BRIEF DESCRIPTION OF THE DRAWINGS

FIG. 6 illustrates one embodiment according to the present invention showing random bits in connection with exemplary calibration bits producing a digital dither on the digital output provided by the ADC illustrated in FIG. 5.

DETAILED DESCRIPTION

Figure 1A:
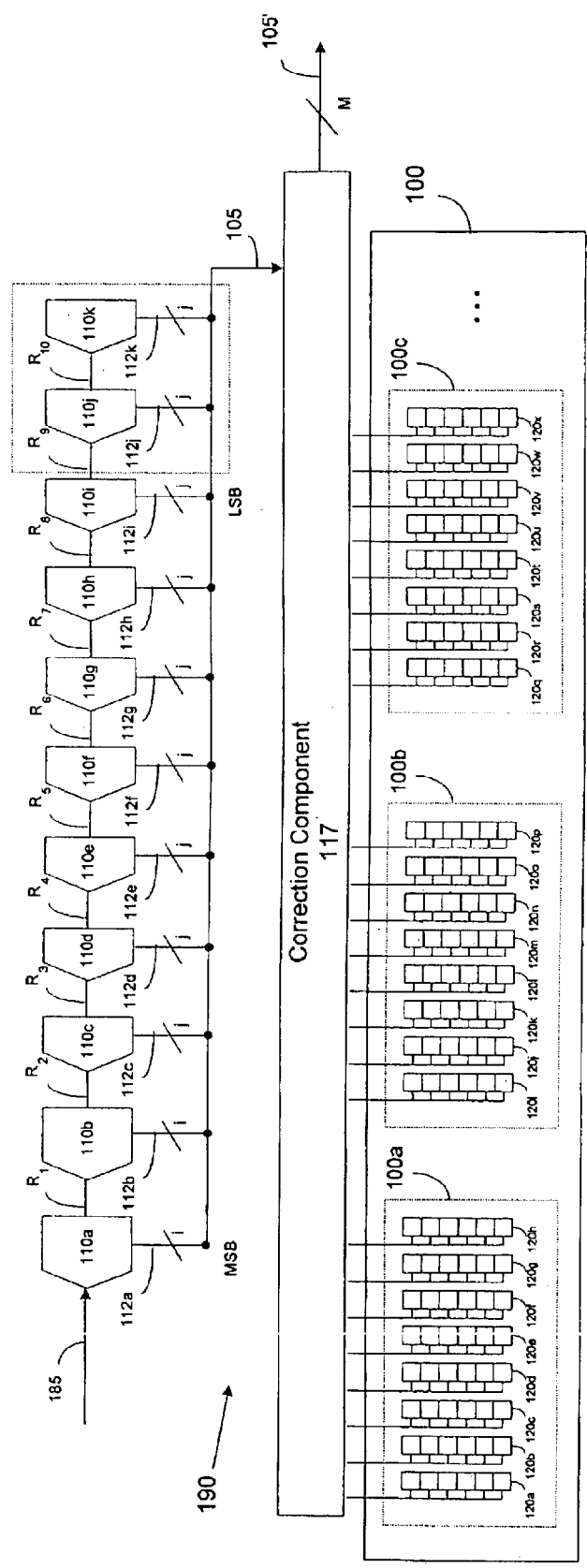
FIG. 1 illustrates an ADC employing additional pipeline stages to produce sub-LSB digital output bits.

The resolution of an ADC arranged in a pipeline depends in part on the number of stages in the pipeline. In general, an ADC converts an analog signal that varies within a particular dynamic range into a digital signal that approximates samples of the analog signal to the resolution of the ADC. For example, the analog input signal provided to the pipeline may be a voltage signal having a peak-to-peak voltage $V_{pp}$ that defines the range of the converter. The resolution of the ADC is related to $V_{pp}/2^n$, where n is the number of bits comprising the digital output signal provided by the ADC. Stated differently, the resolution is related to the swing of the input voltage divided by the number of digital codes used to represent samples of the analog voltage. This generally smallest unit of discrimination (e.g., $V_{pp}/2^n$) is referred to as an LSB (least significant bit). The coefficient for the LSB weight is typically the least significant bit provided by the ADC as part of the digitized output.

Each individual stage in a pipeline may be divided into a plurality of subranges, each subrange having an associated digital code (i.e., a quantization value). When an analog input signal is sampled by a stage in the pipeline, the value of the sample is compared to the subranges of the corresponding stage and the associated digital code is then output by the stage. Pipeline converters may have relatively large errors at the subrange boundaries (particularly in the first few stages of the pipeline) that affect the accuracy of the ADC. To improve the accuracy of the ADC, various calibration techniques are often performed.

For example, calibration bits (also referred to as calibration codes or calibration coefficients) may be stored on the converter (e.g., on the same integrated circuit) and employed to adjust the digital codes provided by the stages in the pipeline. Calibration codes may be implemented as a fuse bank that can be selectively blown to store desired calibration values which may be added to or subtracted from the digital codes provided by the various stages in the pipeline. Alternatively, calibration bits may be stored in other types of memory such as random access memory (RAM) or read only memory (ROM). As discussed above, the resolution of the ADC (i.e., the number of bits provided external to the ADC) may be limited by noise. For example, thermal noise in the pipeline may limit the number of times an analog signal can be meaningfully processed and refined by additional stages. However, an ADC may benefit from calibration at resolutions greater than 1 LSB (i.e., at bit weights that are a fraction of 1 LSB). In particular, calibration to a resolution of ½ LSB, ¼ LSB, ⅛ LSB, etc., may improve the INL of the converter. The INL error describes an ADC's deviation from a linear transfer function.

In conventional ADCs, calibration to a resolution of less than 1 LSB is often performed by adding extra stages to the pipeline. The digital codes provided by the extra stages typically do not contribute to the resolution of the digital output of the ADC. Instead of providing the additional bits external to the ADC, the bits are used internally to calibrate the signal as described in further detail below.

FIG. 1A illustrates an ADC 190 having a pipeline architecture comprising a plurality of stages 110a–110k. The first stage receives an analog signal 185, for example, an analog signal to be digitized. Each stage in the pipeline receives an analog input signal and provides both a digital output signal and an analog output signal (except the final stage in the pipeline). The digital output signal (i.e., digital output bits 112a–112k) of any stage indicates the value of a sample of the analog input signal provided to that stage and the analog output signal (i.e., the residue signal) of that stage indicates a difference between the input analog signal and the digital output bits of the stage.

The various digital output bits 112 from the stages form digital output signal 105. Digital signal 105 is then provided to correction component 117 to generate digital output word 105' of the ADC. Correction component 117 may process digital signal 105 in a number of ways to generate digital output word 105'. For example, correction component 117 may align the digital data 105 to account for delays resulting from the pipeline architecture. Since each stage in the pipeline operates on the residue signal (labeled R1, R2, R3, etc.) provided by the previous stage, the digital output bits provided by the stages during each shift of the pipeline (e.g., a clock cycle, a half clock cycle, or any number of clock cycles required to sample an analog input signal and advance the pipeline appropriately) will correspond to different samples of the input analog signal 185.

For example, the first stage 110a may provide digital output bits 112a for a first sample of analog input signal 185 at a time to and provide a corresponding residue $R_1$. Stage 110b is unable to operate on residue $R_1$ until the residue has been generated by the previous stage (i.e., stage 110a). Stage 110b, therefore, provides digital output bits 112b corresponding to the first sample at a time $t_1$. Simultaneously, stage 110a provides digital output bits 112a corresponding to a second sample of analog signal 185. The nth stage, therefore, will not provide digital output bits for the first sample until time $t_n$. As a result, correction component 117 must arrange and align the various digital output bits into a single word that corresponds to the same sample.

Correction component 117 may also apply calibration information to digital signal 105 to compensate for component mismatch errors, subrange boundary errors, non-linearities in the INL and DNL, etc. Correction component 117 may receive a plurality of bits from calibration unit 100 in order to correct and/or compensate for one or more errors in digital data 105 as described in further detail below. Correction component 117 may be any logic or circuitry capable of performing various alignment and/or calibration functions.

Digital signal 105 is often truncated down to the M-bit resolution provided by ADC 190. For example, stages 110j and 110k may provide digital output bits 112j and 112k that are not, in turn, provided external to the ADC (i.e., are not provided as part of digital output word 105'). Rather, stages 110j and 110k may be used in connection with calibration information provided by calibration component 100 to calibrate the LSBs of signal 105' (e.g., to calibrate the digital output bits provided by stage 110i) as discussed in further detail below.

The first stage (e.g., stage 110a) produces the i most significant bits (MSBs) of digital signal 105. For example, digital output bits 112a provided by stage 110a may indicate uncalibrated coefficients for weights $2^{M-1}$ LSB, $2^{M-2}$ LSB, and $2^{M-3}$ LSB of digital signal 105. Similarly, stage 110b may provide the next i most significant bits, stage 110c may provide the next j most significant bits, and stage 110i may provide the j least significant bits provided by the pipeline. The last bit in the digital code provided by stage 110i indicates the coefficient for the 1 LSB bit weight.

In one embodiment, each of stages 110a and 110b may be 3-bit converter stages and each of stages 110c–110i may be 2-bit converter stages. In some embodiments, the pipeline may include stages having one or more overlap bits to correct for gain errors in the pipeline. For example, each of stages 110a and 110b may be so-called 3.5 bit stages and each of stages 110c–110i may be so-called 1.5 bit stages. However, the number of stages in the pipeline and the arrangement and number of bits provided by each stage is not limited to any number and/or configuration, and may depend on the desired speed, accuracy and/or precision of the ADC.

Figure 1B:
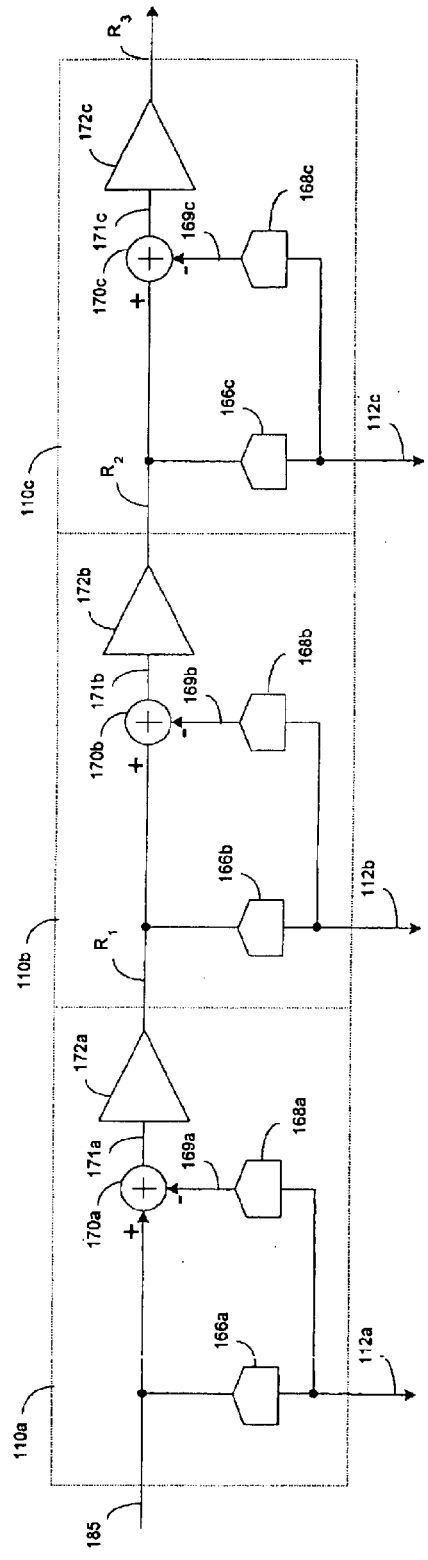

As discussed above, each stage (except for, perhaps, the final stage) also provides an analog signal $R_1$–$R_{10}$, referred to as the residue signal, to the subsequent stage of the pipeline. The residue signal represents the difference between the analog input signal and the digital output signal. Each residue signal generated by a stage is digitized by the subsequent stage to produce the next most significant bits of digital signal 105. FIG. 1B illustrates exemplary components comprising stages 110a, 110b and 110c of ADC 190. Stage 110a receives the analog signal 185 to be converted to a digital signal by the pipeline. Analog signal 185 may be provided to an i-bit analog-to-digital converter 166a to provide digital output bits 112a. ADC 166a may be, for example, any of various flash converters. The digital output bits 112a are both provided to correction component 117 as shown in FIG. 1A, and to a digital-to-analog converter (DAC) 168a to convert the signal back to analog form.

Digital output bits 112a will likely represent a value different then the value of analog signal 185, due in part to quantization errors of the stage. Accordingly, analog signal 169a will be indicative of the quantization error of the stage. This error may be indicated by forming a difference between the input analog signal 185 and analog signal 169a, for example, by providing the signals to summing element 170a. The difference signal 171a may then be amplified, for example, by amplifier 172a to provide residue signal $R_1$.

The difference signal 171a is often amplified such that the residue signal has a desired range. For example, amplifier 172a may have a gain of two, or any other gain that achieves a desired range for the subsequent stage. Residue $R_1$ may then be provided as the analog input signal to be operated on by the successive stage. As shown in stages 110b and 110c, this operation may be repeated at each stage in the pipeline, wherein each successive stage provides a number of the next most significant bits of digital signal 105, and generates a residue to be operated on by the next stage in the pipeline. Each of the stages in the pipeline may be substantially the same as any of stages 110a–110c illustrated in FIG. 1B. In this way, each stage refines the digital output and increases the resolution of digital signal 105. Stage 110i provides the j least significant bits of digital output word 105' and the $j^{th}$ bit of digital output 112i provides a 1 LSB resolution.

As discussed above, each stage in the pipeline may be subdivided into a plurality of subranges, each subrange having an associated value (often referred to as a digital code, or simply a code). When the value or level of the analog input signal to a stage (e.g., the value of the analog signal at the time when the analog signal is sampled) falls within a particular subrange, the associated code is provided as the digital output signal for the respective stage (e.g., provided as a respective one of digital output bits 112).

Figures 2A, 2B:
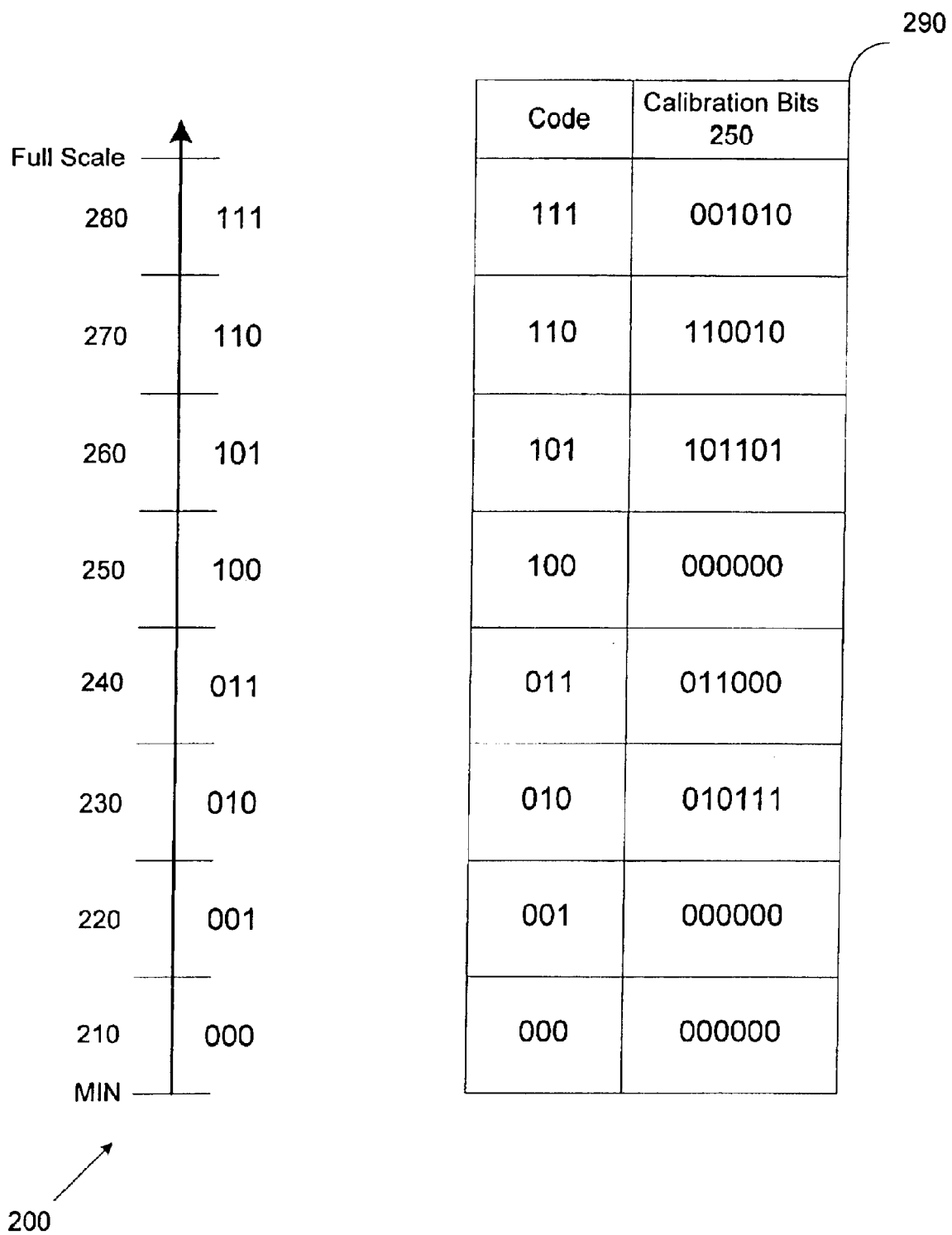
FIGS. 2A and 2B illustrate subranges of an exemplary stage of a pipeline ADC and associated calibration coefficients.

FIG. 2A illustrates exemplary codes for subranges of one stage (e.g., stage 110a) of a pipeline. In FIG. 2A, a range 200 defines the minimum and maximum values of an analog input signal to be digitized. For example, range 200 may vary from 0 to full scale (e.g., from a zero voltage to a maximum peak value of a reference voltage signal). Alternatively, range 200 may vary from a negative minimum to a positive maximum, or may vary across any suitable range that describes values of an analog input signal. Range 200 may include a plurality of subranges 210–280. When an input analog signal is sampled, its value is compared with the subranges and the digital code associated with the appropriate subrange as shown may be output as, for example, digital output bits 112a, 112b, etc. For example, if the value of a given sample of the input analog signal falls within subrange 260, the stage outputs a digital code of 101. Accordingly, in exemplary range 200, an analog input signal is quantized into one of eight possible codes.

The stages of the pipeline may be vulnerable to various errors. For example, relatively large errors may be generated at the sub-range boundaries. In many ADCs, one or more sample and hold circuits may perform the comparison between an analog input signal and subranges of the respective stage of the pipeline. Sample and hold circuits often rely on matched capacitors to accurately determine a value of a sample of the analog signal. However, manufacturing tolerances often yield electronic components, such as capacitors, that do not have identical characteristics and behavior. Accordingly, errors in many sample and hold circuits result from generally unavoidable capacitor mismatches.

Capacitor mismatch may result in a number of different types of errors. For example, input signal sampling capacitors may result in errors in the output of the ADC. Residue signals typically must be generated with substantial precision. Accordingly, capacitor mismatch errors in the DAC and/or summing elements employed to provide residue signals may cause errors that, ultimately, effect the precision and accuracy of the ADC. In particular, capacitor mismatch errors may cause the addition (or subtraction) to be incorrect and subsequently produce residue signals that carry errors of a magnitude that depends in part on the extent of the capacitor mismatch. The largest of these errors typically appear in the first several stages of the pipeline.

Calibration component 100 in FIG. 1 may be provided to calibrate for these and other errors. For example, calibration component 100 may include calibration units 100a, 100b and 100c to calibrate stages 110a–110c, respectively. Each calibration unit may include a plurality of calibration registers to store calibration codes for the various sub-ranges of the respective stages. For example, calibration unit 100a may include 8 registers 120a–120h to calibrate respective subranges of stage 110a (e.g., subranges 210–280 in FIG. 2A). Calibration registers are often fuse banks, each fuse capable of storing a bit. For example, an open circuit condition (blown fuse) may indicate a 0 value and a closed circuit condition (connected fuse) may indicate a 1 value. The values stored by the calibration registers indicate a modification to one or more digital codes provided by the respective stage.

FIG. 2B illustrates a table 290 listing an association between digital codes for each of the sub-ranges and an indication of how the sub-range is to be calibrated. For example, each sub-range may have an associated plurality of calibration bits, also referred to herein as a calibration coefficient. In the embodiment illustrated in FIG. 2B, each sub-range is assigned a six bit calibration coefficient. The value of the coefficient may be determined, for example, during post-production testing the of the ADC. Accordingly, registers 120a–120h in FIG. 1 may include 48 bits for calibrating stage 110a of ADC 190. It should be appreciated that the arrangement illustrated in FIGS. 2A and 2B is merely exemplary. The range of a stage may be divided into any number of sub-ranges and the digital codes may include any number of bits. In some embodiments, one or more stages may share overlap bits with a successive stage. In addition, calibration coefficients may be of any length or one or more sub-ranges may not have an associated calibration coefficient.

As shown in FIG. 2B, a calibration code may be associated with each of the sub-ranges to provide correction. Each time a stage samples its input analog signal, the corresponding digital code and the associated calibration code are provided to correction component 117. Assume, for example, that at time t, analog input signal 185 is sampled and determined to have a value that falls within the third sub-range of stage 110a (e.g., sub-range 230 in FIG. 2B). As a result, stage 110a provides digital code 010 to correction component 117. In response to receiving digital code 010, correction component 117 selects the associated calibration code stored in register 120c (e.g., 010111) to calibrate the digital output for this sample. For example, correction component 117 may be configured to add, subtract or otherwise modify digital signal 105 with the value stored in register 120c to provide in part calibrated digital output word 105'.

It should be appreciated that the digital codes provided by the various stages are coefficients for associated bit weights. As discussed above, the digital code provided by stage 110a may provide coefficients for weights $2^{M-1}$, $2^{M-2}$ and $2^{M-3}$ LSB, where M is the number bits of digital output word 105' provided external to the ADC. Likewise, the bits of the calibration codes have associated bit weights. For example, the bits of the calibration codes in FIG. 2B may be coefficients for bit weights of $2^5$–$2^0$ LSB. Under such circumstances, calibration of ADC 190 is to the resolution of the ADC. However, it may be desirable to calibrate ADC 190 to a higher resolution.

In order to calibrate an ADC to a resolution greater than 1 LSB, conventional techniques have employed one or more additional sub-LSB stages in the pipeline. For example, stages 110j and 110k may provide digital output bits having weights of ½ LSB and ¼ LSB, respectively. Accordingly, calibration codes having sub-LSB bit weights (i.e., coefficient for $2^{-1}$, $2^{-2}$, $2^{-3}$ LSB, etc.) can operate on the digital output bits provided by the sub-LSB stages to further calibrate the digital output word 105'. The term "sub-LSB" refers generally to subject matter related to a resolution greater than a resolution provided by an ADC. Sub-LSB can also be viewed as an increment or unit smaller than 1 LSB. It should be appreciated that increasing the resolution of an ADC (of the pipeline and/or of calibration) corresponds to reducing bit weight fractions (of calibration bits and/or digital output bits). For example, calibration to ¼ LSB is of a greater resolution than calibration to a resolution of ½ LSB.

Generally, the sub-LSB digital output bits (e.g., digital codes provided by stages 110j and 110k) are not useful external to the ADC due to noise, such as thermal noise, in the pipeline. For example, thermal variation in the pipeline may result in significant enough fluctuation in digital output bits from stages 110j and 110k such that the information is not substantially more correlated to the respective analog input signal than noise. As such, the sub-LSB digital output bits typically do not contribute to the word length (i.e., resolution) of digital output word 105'. However, the sub-LSB digital output bits may be useful internal to the ADC to improve the linearity and distortion of the ADC, as described in further detail below.

Applicant has appreciated that since digital output bits from sub-LSB stages may be indistinguishable from noise in the pipeline, the relatively large and expensive stages may be replaced with simpler components to produce digital output bits that contribute to sub-LSB calibration. For example, the stages illustrated in FIG. 1B include relatively expensive and complex converters (both an ADC and a DAC) including sample and hold circuits, amplifiers, summing elements, etc. Since at higher resolutions, these stages may provide data that is substantially uncorrelated with the analog input signal, the relatively complex stages may be wasteful. In one embodiment according to the present invention, a random number generator is provided to generate digital codes for one or more sub-LSB weights. The sub-LSB codes may then be calibrated to facilitate, for example, improved linearity, reduced distortion and/or error correction in the ADC.

Figure 3:
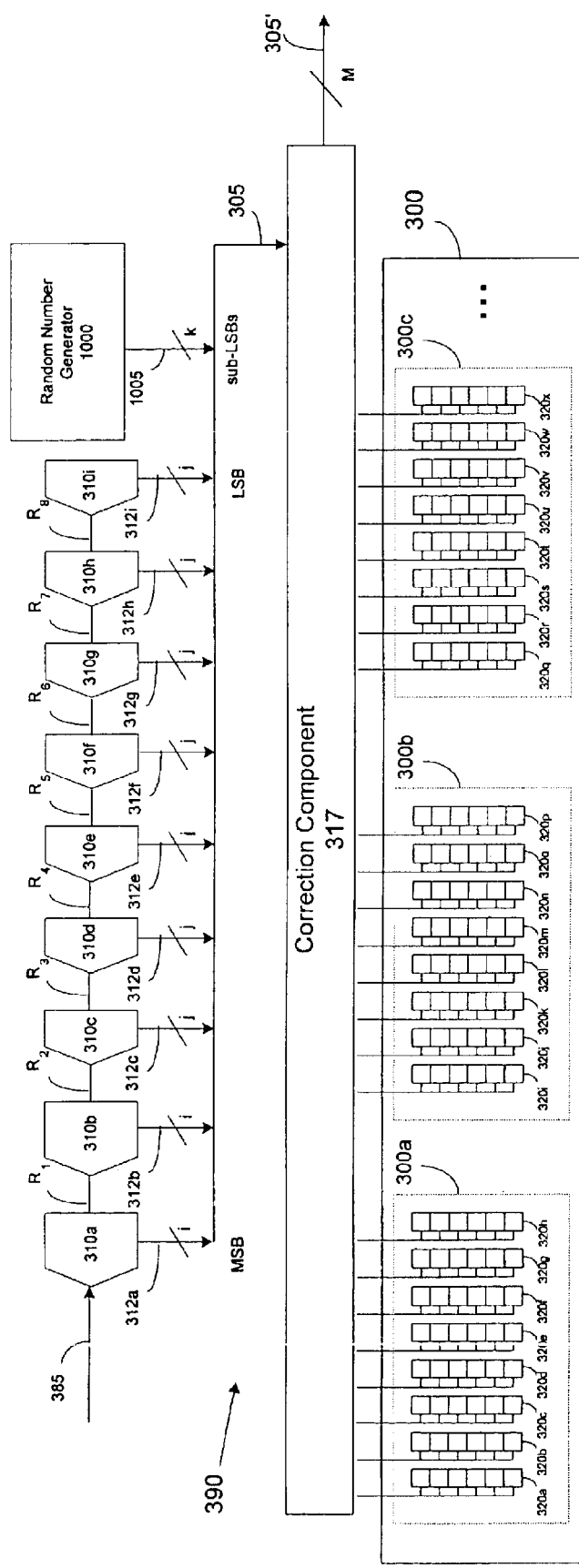
FIG. 3 illustrates one embodiment of an ADC according to the present invention having a random number generator to provide one or more random bits for sub-LSB bit weights.

FIG. 3 illustrates one embodiment of an ADC according to the present invention. ADC 390 may be similar to ADC 190 described in connection with FIG. 1. However, sub-LSB stages have been removed and replaced with random number generator 1000. Random number generator may provide random bits 1005. Random bits 1005 may include any number of bits to provide, in connection with calibration information provided by calibration component 300, a desired correction to digital signal 305. Generally, the bits provided by random number generator 1000 are coefficients for sub-LSB bit weights.

A random number generator may be any component, logic and/or circuitry adapted for the purpose of generating one or more bits having substantially random values. For example, each bit provided by random number generator 1000 will take a value of 1 and 0 with substantially the same frequency and in essentially arbitrary order. Typically, the random bits generated by a random number generator are not a function of or coupled to analog signals in the pipeline and/or not correlated with other signals in the pipeline. It is to be understood that the term "random" includes pseudo-random number generation and includes any means of generating one or more bits wherein the chances of each bit taking on a 0 value or a 1 value whenever the one or more bits is generated is substantially the same.

Figure 4A:
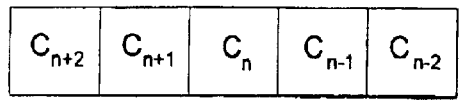
FIGS. 4A–4D illustrate embodiments according to the present invention where a random number generator is arranged to provide one or more random bits to adjust the truncated digital output.

FIGS. 4A–4D illustrate the interaction between random digital output bits, calibration bits and the digital output from the various stages in the pipeline. FIG. 4A illustrates a calibration register 420 having calibration coefficients C. The subscript n denotes a bit weight of 1 LSB (e.g., the least significant bit provided external to the ADC). As shown, calibration register 420 stores coefficients for bit weights 4, 2, 1, ½ and ¼ LSB. Calibration register 420 may be configured to calibrate a subrange of, for example, stage 310a of FIG. 3.

Figure 4B:
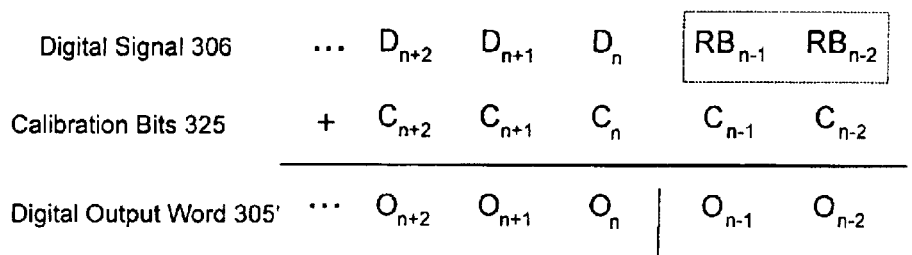

FIG. 4B illustrates an example of how correction component 317 may process the digital outputs from the various stages, calibration information and random bits to provide calibrated digital output word 305' according to one embodiment of the present invention. Digital signal 306 represents digital output bits from the various stages of the pipeline that have been aligned in time to correspond to the same sample. The individual bits are represented by coefficients D. For example, digital signal 306 may be digital output bits 305 that have been aligned to correspond to a single sample of the analog input signal.

Calibration bits 325 may be calibration bits provided by calibration unit 300 in FIG. 3, the individual coefficients of which are represented by calibration bits C. For example, in FIG. 4B, calibration bits 325 may be obtained from register 420. Calibration bits C are aligned with coefficients D according to bit weight. Calibration bits C and digital signal D may then be added together (e.g., by correction component 317) to provide calibrated digital output word 305', represented by coefficients O. It should be appreciated that while only the least significant bits are illustrated, digital signal 306 is of the word length of the pipeline. For example, if the ADC is a 12 bit converter, the word length of digital signal 306 will include 12 bits. The most significant bits are not shown but are indicated by the ellipses. Calibration bits C may be of any length and will depend on the range and resolution requirements of a particular ADC device.

Digital output word 305' is typically truncated at the LSB resolution as indicated by truncation line 450. For example, a 12-bit converter will only provide 12 bits external to the ADC even though the ADC may internally generate digital signal 306 and calibration bits 325 at a sub-LSB resolution to compensate for various errors in the ADC. As discussed above, conventional ADC implementations provide sub-LSB digital output bits using additional pipeline stages. However, pipeline stages may include sample and hold circuits, comparators, amplifiers and other relatively expensive and space and/or power consuming electronic circuitry to provide digital output bits that may be essentially indistinguishable from noise. By providing random bits RB from circuitry other than a pipeline stage, the cost and power consumption of the stage or stages may be eliminated.

It should be appreciated that carry over from sub-LSB addition will sometimes effect LSB bit weights depending on values of calibration bits C and random bits RB. Providing random bits can be used to effect an on average sub-LSB adjustment to the bits provided external to the ADC. For example, if calibration bits $C_{n-1}$ and $C_{n-2}$ in FIG. 4B have values of 0 and 1, respectively, seventy-five percent of the time, the sub-LSB bits will have no effect on the digital output. That is, when the random number generator provides random bits $RB_{n-1}$ and $RB_{n-2}$ having values of 00, 01 and 10, respectively, addition of sub-LSB calibration bits 01 will have no effect $O_n$. However, twenty-five percent of the time, random bits $RB_{n-1}$ and $RB_{n-2}$ will take on values of 11, respectively. When the random number generator produces a 11, the addition with sub-LSB calibration coefficients 01 will result in a 1 LSB change in the digital output provided by the ADC. Accordingly, on average, the digital output provided by the ADC will have a ¼ LSB adjustment. This on average calibration is referred to as a digital dither as further described below in connection with FIGS. 5, 6 and 7.

Figure 4C:
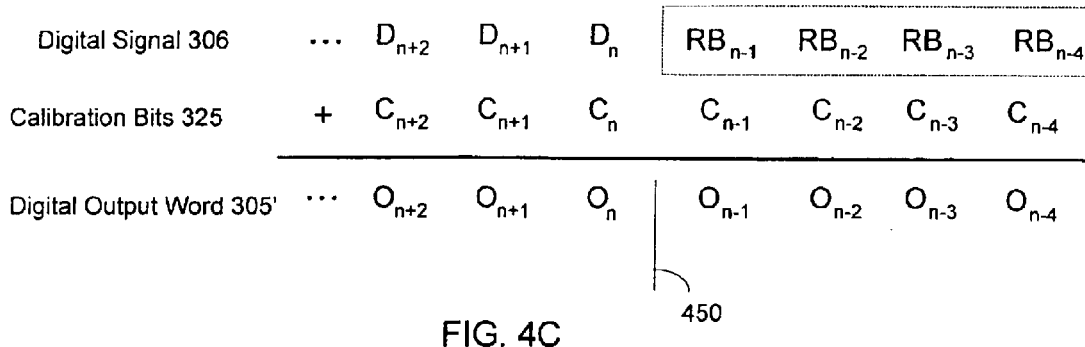
Figure 4D:
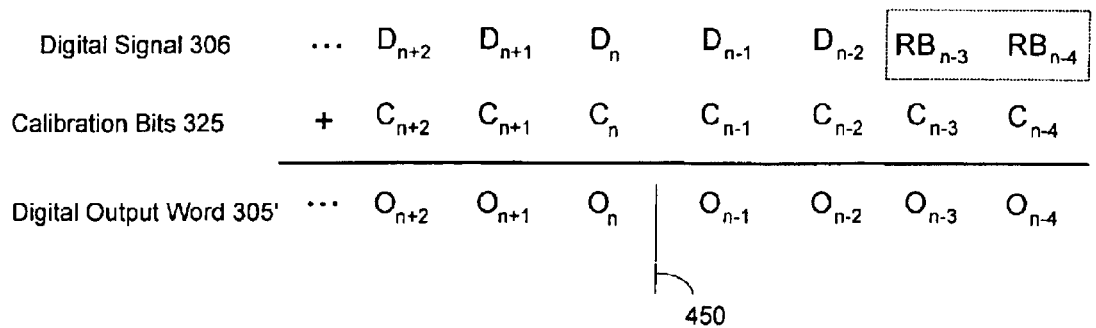

As shown in FIGS. 4B–4D, sub-LSB components may be arranged in a variety of ways. For example, one or more sub-LSB digital output bits may be provided by a random number generator (e.g., random number generator 1000 in FIG. 3) in any number of different arrangements with or without any number of sub-LSB stages. FIG. 4B illustrates a pipeline wherein a random number generator provides output bits $R_{n-1}$ and $R_{n-2}$, for example, having bit weights of ½ and ¼ LSB, respectively. FIG. 4C illustrates an embodiment where a random number generator provides random output bits $R_{n-1}$, $R_{n-2}$, $R_{n-3}$ and $R_{n-4}$ having, for example, bit weights of ½, ¼, ⅛ and 1/16 LSB, respectively.

In some embodiments, additional pipeline stages provide some of the sub-LSB digital output bits and a random number generator provides one or more higher resolution bits. FIG. 4D illustrates an embodiment wherein coefficients for ½ and ¼ LSB bit weights are provided by sub-LSB pipeline stages. However, the higher resolution digital output bits (e.g., ⅛ and 1/16 LSB, etc.) may be provided by a random number generator. In general, if a pipeline stage does not provide digital bits that are substantially more correlated than noise in the pipeline, it may be preferable to replace the stage with a random number generator to save the expense of manufacturing the stage and to save power consumption required by the stage during operation.

It should be appreciated that while FIG. 4B illustrates a single calibration coefficient C, a pipeline may have numerous calibration values that are added to the digital output bits 306 to correct for various errors in the pipeline. For example, a calibration coefficient for each stage in the pipeline may added to the digital output bits 306, or a calibration coefficient for the first one or first several stages in the pipeline. Accordingly, calibration bits 325 may be viewed as the sum of the calibration bits employed to calibrate the digital output bits of the pipeline.

Figure 5:
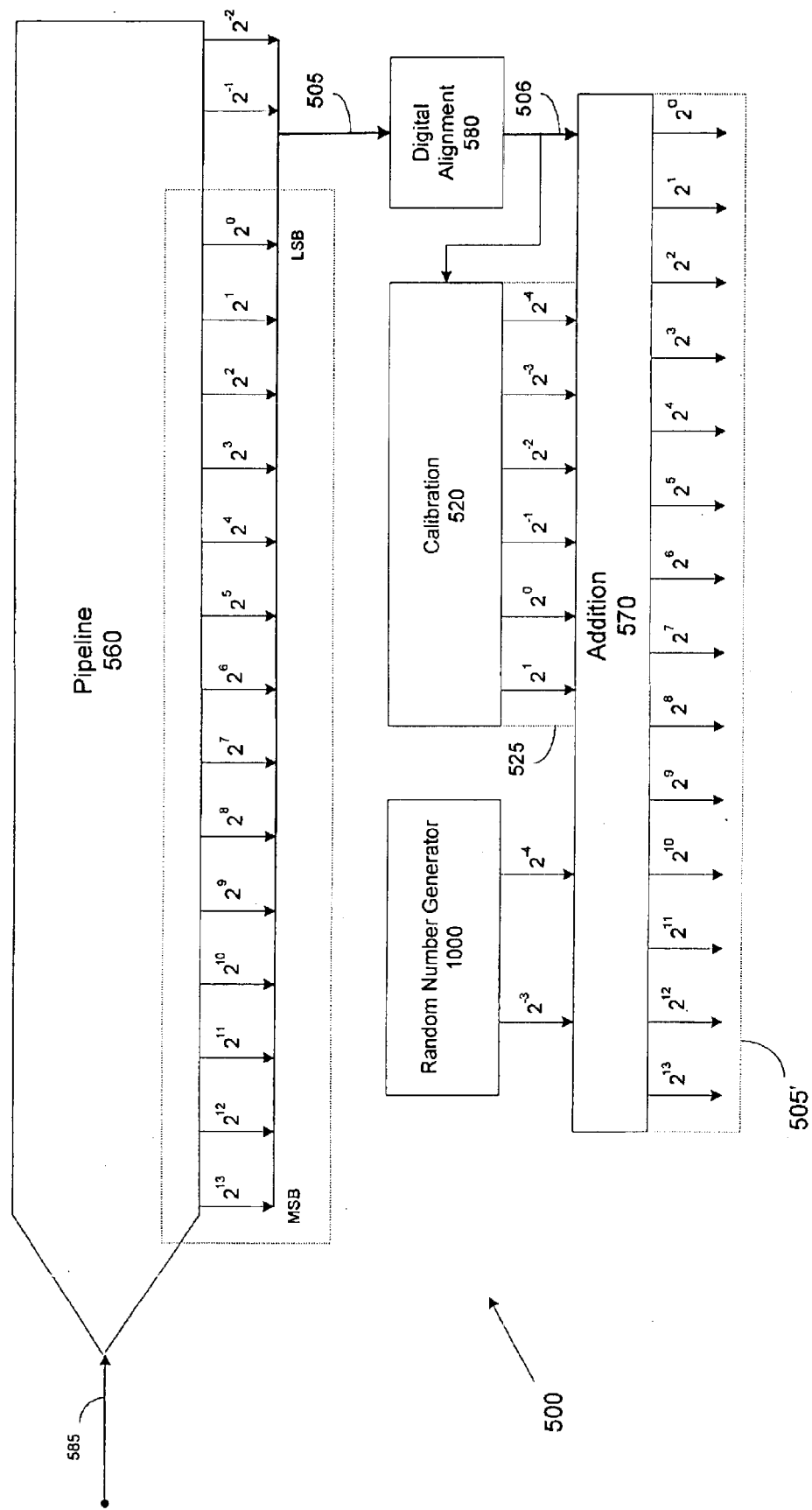
FIG. 5 illustrates one embodiment of an ADC according to the present invention having one or more stages providing sub-LSB bits and a random number generator providing one or more sub-LSB bits.

FIG. 5 illustrates one embodiment of an ADC employing a digital dither to correct for one or more errors at a sub-LSB resolution. ADC 500 is a 14-bit converter. That is, 14 bits of digital information are provided for each sample of analog signal 585 and provided as digital output signal 505' (i.e., coefficients at bit weights $2^{13}$–$2^0$). ADC 500 includes a pipeline 560 having one or more stages configured to digitize the analog input signal 585. The pipeline may have any number of stages to provide bits comprising digital signal 505. For example, pipeline 560 may include a plurality of stages to provide digital codes for bit weights $2^{13}$–$2^0$, and one or more stages to provide digital codes for sub-LSB weights $2^{-1}$ and $2^{-2}$. As such, pipeline 560 is a 16 bit pipeline providing two digital bits at sub-LSB resolution (i.e., similar to the arrangement shown in FIG. 4D).

Digital alignment 580 receives the 16 bits provided by pipeline 560 while the analog signal 585 is successively sampled and aligns the received bits to form digital output word 506. Digital output word 506 differs from digital signal 505 in that digital alignment 580 has arranged the various digital output bits received from the pipeline during different times such that digital output word 506 includes digital codes corresponding to a single sample of analog input signal 585. Digital alignment 580 may provide the sample aligned 16-bit digital output word 506 to calibration component 520 (or a subset thereof) and addition block 570. Based on the digital codes comprising digital output word 506, calibration 520 provides appropriate coefficients for bit weights $2^1$ through $2^{-4}$ to calibrate any of various errors that result in pipeline 560. It should be appreciated that calibration component 520 may provide any number of calibration bits. For the purposes of illustrating a digital dither in connection with FIG. 6, only a single calibration coefficient is illustrated in FIG. 5 (alternatively, calibration bits 525 could be viewed as the sum of all calibration bits that provide coefficients for bits weights $2^1$–$2^{-4}$, even though addition block 570 may do the actual addition).

Random number generator 1000 provides coefficients for bit weights $2^{-3}$ and $2^{-4}$. For example, random number generator may be any component, circuitry or logic capable of arbitrarily generating one or more bits that take on a 1 or a 0 value randomly. Addition 570 arranges the digital output word provided by digital alignment 580, calibration bits from calibration 520, and random bits from random number generator 1000 according to bit weight and adds the coefficients together to provide calibrated digital output word 505'. As discussed above, addition 570 may truncate the sum at the LSB to provide 14 bits external to the ADC. However, the sub-LSB bits are part of the addition and may effect the output bits comprising signal 505' on the average.

FIG. 6 illustrates one embodiment of how the random bits provided by random number generator 1000, in combination with the calibration bits provided by calibration 520, may be employed to provide a digital dither to trim an INL error of the ADC at a sub-LSB resolution. Table 690 illustrates the LSB additions of ADC 500 with and without calibration for a number of coefficient configurations for bit weights $2^2$–$2^{-4}$. Table 690 is separated into an input side (table 690a) and an output side (table 690b). Table 690a illustrates a number of possible coefficient values for the input to addition 570 in FIG. 5.

For example, the first column in table 690a illustrates six possible coefficient combinations provided by the pipeline for bit weights $2^2$–$2^{-4}$ (after being same-sample aligned). The second column illustrates six possible coefficient combinations provided by the sub-LSB stages for bit weights $2^{-1}$ and $2^{-2}$ (after being same-sample aligned). For each of the above coefficient combinations, the third column illustrates all of the possible coefficients that could be generated by random number generator 1000. (Each row, therefore, in fact illustrates four different coefficient combinations for bit weights $2^2$–$2^{-4}$ that may be provided to addition 570.)

The fourth column illustrates calibration bits provided by calibration component 520 for bit weights $2^{-3}$ and $2^4$ in response to the digital codes comprising the same-sample digital output provided by digital alignment 580. It should be appreciated that while the operations described below are illustrated using only a number of the least significant bits of the pipeline, the operation is also performed on the MSB bits from the pipeline. For example, the calibration bits provided by calibration 520 may be in response to a digital code provided by one of the MSB stages, for example, the first stage in the pipeline. However, since the focus of the illustration is on sub-LSB calibration, the MSB outputs are not likely to be affected by the high resolution calibration. Accordingly, for clarity of presentation, only a number of the least significant bits (coefficients for bit weights $2^2$–$2^{-4}$) are shown. However, the addition of the various more significant bits are similarly carried out by addition 570.

For the first three rows, the calibration coefficients provided by calibration component 520 have zero-valued coefficients for bit weights $2^{-3}$ and $2^{-4}$. For the second three rows, the calibration coefficients provided by calibration component 520 have a zero and one-valued coefficient for bit weights $2^{-3}$ and $2^{-4}$, respectively. The change in the calibration coefficient may be the result of a sub-range boundary in one of the MSB stages. For example, assume that at least the first stage of the pipeline is being calibrated. The calibration bits shown in column four may be provided by calibration component 520 in response to the digital code identifying the subrange of the first stage corresponding to a sample of the analog input signal. Accordingly, the change in calibration coefficient provided by calibration component 520 may indicate a subrange boundary in the first stage.

Table 690b illustrates coefficient values generated by addition 570 for the three least significant bits of digital output word 505', both with and without calibration. The first column illustrates the result of adding the first three columns of table 690a (i.e., uncalibrated). Since there is no addition being performed, the output is merely the input truncated to 1 LSB. The second column illustrates the result of adding the first four columns of table 690b (i.e., calibrated). When the calibration bits have zero coefficients for the sub-LSB weights (i.e., in the first three rows of table 690a), the LSB bits of the output are not effected. However, when the calibration bits have at least one non-zero coefficient for the sub-LSB weights (i.e., in the second three rows of the table 690a), the LSB bits of the output will sometimes be effected. In particular, the length of the output block 695 (i.e., LSB output bits 100), is shortened as a result of the sub-LSB calibration.

Specifically, when the LSB bits of the input are 100 for bit weights $2^2$, $2^1$ and $2^0$, the sub-LSB bits (i.e., the bits provided by the sub-LSB stages and the random bits) can take on 16 possible values. With a calibration coefficient of 01 for bit weights $2^{-3}$ and $2^{-4}$, respectively, 15 of the 16 combinations will have no effect on the LSB bit. That is, the LSB output will be 100. However, 1 out of the 16 combinations will change as a result of the calibration (i.e., 1001111), effecting a dither on the LSB output bits. That is, since the bits provided for sub-LSB weights $2^{-3}$ and $2^{-4}$ are provided randomly, on average, the LSB output bit will be effected 1 out of 16 times. As such, the digital output has been "trimmed" by 1/16 LSB (i.e., calibrated to a sub-LSB resolution).

Figure 7:
FIG. 7 illustrates another embodiment according to the present invention showing random bits in connection with exemplary calibration bits producing a digital dither on the digital output provided by the ADC illustrated in FIG. 5.

FIG. 7 illustrates another embodiment employing a digital dither according to the present invention. In the embodiment shown in FIG. 7, calibration bits for the last three rows are 1 and 0 for bit weights $2^{-3}$ and $2^{-4}$, respectively. Accordingly, 2 out of the 16 combinations arising when the LSB bits are 100 will result in a change to 101 after calibration. Accordingly, the dither effects a calibration to a resolution of 1/8 LSB. It should be appreciated that calibration bits may be provided in association with any subrange such that any selected output block is trimmed to a desired length.

Testing of an ADC after the device has been manufactured may indicate errors at a resolution higher than the resolution of the device. For example, INL errors may be tested by providing a sinusoidal analog input to the device and recording the digital output provided by the device. The deviation of the transfer function from a line is related to the INL error. However, the transfer function may deviate from the linear by increments smaller than the LSB of the device. Accordingly, calibration at the LSB resolution would overcompensate for such errors. However, the digital output may be dithered to a degree that effects a sub-LSB calibration as described in the exemplary calibration of FIGS. 6 and 7.

It should be appreciated that the arrangement and values illustrated in FIGS. 5, 6 and 7 are merely exemplary. Any number of calibration bits having coefficients for selected bit weights may be chosen to effect a desired sub-LSB calibration. For example, calibration bits having non-zero coefficients may be selected at any resolution to effect a dither on the output at resolutions of ½, ¼, ⅛ LSB, etc., or any combination thereof. It should further be appreciated that concepts related to dithering (i.e., providing on average calibration) may be applied to correct for any number and variety of errors present in an ADC.

Figure 8A:
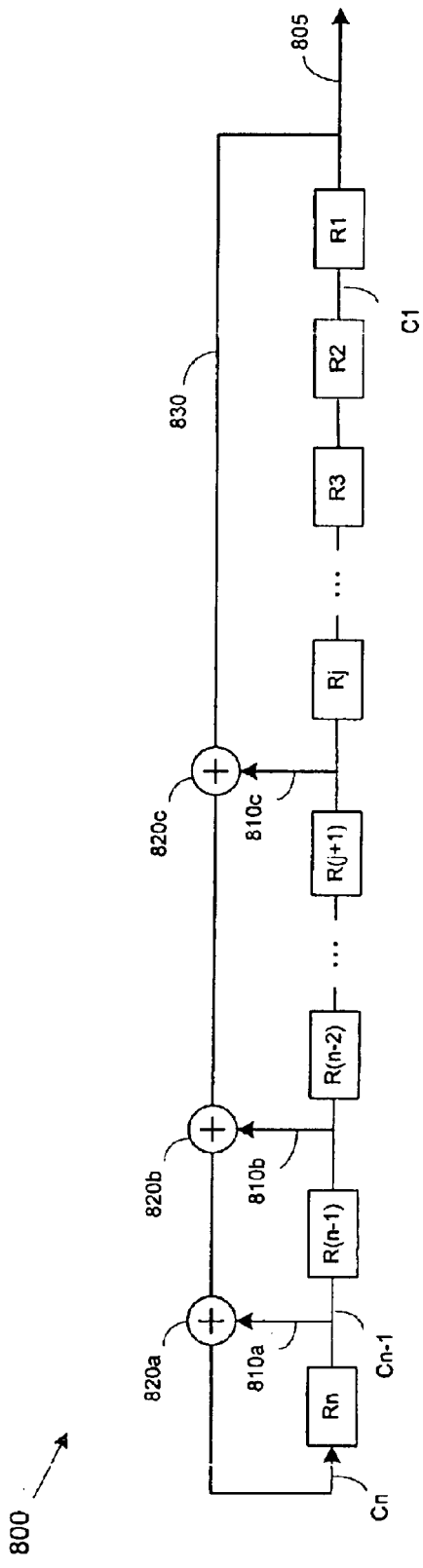
FIGS. 8A and 8B illustrate one embodiment of a random number generator implemented as a linear feedback shift register (LFSR) suitable to facilitate various aspects of the present invention.
Figure 8B:
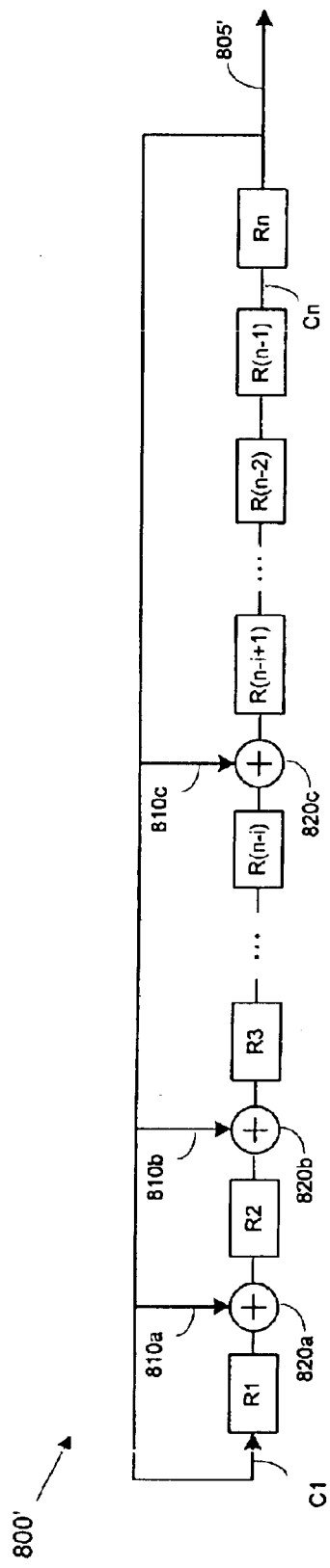

FIGS. 8A and 8B illustrate one embodiment of a random number generator that may be employed to facilitate various aspects of the present invention. An effective method of generating random or pseudo-random bits involves linear feedback shift registers (LFSRs). An LFSR typically takes one of two forms; a simple shift register generator (SSRG) or a modular shift register generator (MSRG). SSRG is often referred to as the Fibonacci implementation and the MSRG is often referred to as the Galois implementation. FIGS. 8A and 8B illustrate the two forms, respectively.

LSFR 800 in FIG. 8A illustrates the SSRG or Fibonacci form of an LFSR arranged to provide random bits at an output 805. LSFR 800 includes a plurality of storage elements or stages Rn–R1, each storing a single binary value and connected together so as to perform a right shift (i.e., binary values shift from Rn towards R1). For example, storage elements Rn–R1 may be a bank of flip-flops or a register operating on a clock. On each clock pulse, the contents of each storage element may be shifted one element to the right via shift connections Cn–C1. The value shifted out of storage element Rn may be provided as output 805 of LSFR 800. Accordingly, on each clock pulse a bit of a binary sequence may be generated. In addition to the shift connections Cn–C1, LFSR may also include a plurality of feedback connections or "taps" formed at various stages of the LFSR. For example, LFSR 800 includes feedback connections 810a–810c. Each feedback connection provides the output of a corresponding stage of the LFSR to a respective summing element 820a–820c. The summing elements may perform modulo-2 arithmetic on its inputs (i.e., the summing elements may perform a logical exclusive-or (XOR) operation on binary input). A feedback loop 830 is thus formed between storage element Rn and R1, the feedback value provided to Rn resulting from summing register values at each of the plurality of feedback connections. The number and arrangement of feedback connections determines, in part, characteristics of the resulting random sequence provided at output 805.

LSFR 800' in FIG. 8B illustrates the MSRG or Galois form of an LFSR. LSFR 800' includes many of the same components as LSFR 800. For example, LSFR includes a plurality of storage elements R1–Rn. However, the arrangement of the storage elements and the feedback connections differ from the configuration of the Fibonacci form. In particular, the storage elements are labeled in reverse order and binary values shift from storage element R1 to Rn. In addition, the feedback loop is directly connected from storage element Rn to R1 via connection C1. In a MSRG implementation, the summing elements are arranged along the shift connections rather than along the feedback connections as in the SSRG implementation.

In particular, the feedback connections (i.e., feedback connections 810a–810c and any other connections that may be present but not shown) and associated summing elements (i.e., summing elements 820a–820c and any other summing elements provided but not shown) perform the modulo-2 sum of the feedback value at connection C1 with the values stored at respective stages of the LFSR. The resulting sum is then provided to the subsequent stage of the LFSR. Accordingly, LFSR 800' performs a modular shift. As with LFSR 800, the number and arrangement of feedback connections determines various properties of the binary sequence generated at output 805' and may be chosen to provide particular sequences as described in further detail below.

LFSR generators produce periodic sequences. Conventional LFSR generators typically generate sequences by providing a single value of the sequence, referred to as a "chip" and then iterating to provide subsequent chips (i.e., random bits) in the sequence. For example, LFSR 800' will produce a sequence of chips at output 805' having a period that depends both on the number of stages n in the LFSR and on the arrangement of the feedback connections. An LFSR having n stages has $2^n$ possible states. That is, the n stages of an LFSR can store $2^n$ unique binary numbers. It should be appreciated that should the state of an LFSR repeat, so will the sequence that is generated at its output. Accordingly, the period of a binary sequence generated by an LFSR having n stages will not be greater than $2^n$ chips.

However, an LFSR will only pass through each of the $2^n$ states if the proper feedback connections are provided. That is, the positioning of feedback connections along the LFSR determines, in part, the period of the generated sequence. Accordingly, when provided appropriate feedback connections, an n-stage LFSR generates a sequence having a period of $2^n-1$ chips (the trivial state wherein all stages are zero is generally not considered). Such a sequence is referred to herein as a "maximal length sequence" or "M-sequence".

For example, a maximal length LFSR (i.e., an LFSR having feedback connections that produce an M-sequence) having 31 stages (e.g., flip-flops) will have a period of $2^{31}-1$. That is, the maximal length LFSR will produce $2^{31}-1$ random bits before repeating. Any number of stages may be used to provide a suitable random number generator. Accordingly, a maximal length LFSR may be implemented in a pipeline ADC to provide any number of random bits having sub-LSB bit weights. For example, in a pipeline ADC employing two random bits of sub-LSB bit weight, the ADC may collect bits generated by the LFSR over two shifts of the LFSR and provide them to be calibrated as discussed above in connection with FIGS. 3–7.

It should be appreciated that an LFSR is only one method of implementing a random number generator. Any hardware and/or software implementation capable of generating random or pseudo-random bits may suitable and is considered to be within the scope of the invention.

Various aspects of the present invention may be may be used alone, in combination, or in a variety of arrangements not specifically discussed in the embodiments described in the foregoing and is therefore not limited in its application to the details and arrangement of components set forth in the foregoing description or illustrated in the drawings. The invention is capable of other embodiments and of being practiced or of being carried out in various ways. In particular, various aspects of the present invention may be practiced with ADC devices of a number of types, arrangements and capabilities. No limitations are placed on the device implementation. The type, extent and implementation of calibration techniques is not limited to the exemplary embodiments illustrated herein.

In addition, various aspects of the invention described in one embodiment may be used in combination with other embodiments and is not limited by the arrangements and combinations of features specifically described herein. Various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. In an analog-to-digital converter having a plurality of stages arranged in pipeline, a method of performing a digital dither to provide a digital output signal, the method comprising acts of:

generating a plurality of digital output bits from samples of an analog input signal, the plurality of digital output bits having associated bit weights including an LSB bit weight;

generating at least one random bit having a sub-LSB bit weight;

providing a plurality of calibration bits, at least one of the plurality of calibration bits having a sub-LSB bit weight; and applying the calibration bits to the plurality of digital output bits and at least one random bit to form the digital output signal.

2. The method of claim 1, wherein the act of applying the calibration bits includes an act of adding the plurality of digital output bits, the at least one random bit and the plurality of calibration bits according to bit weight.

3. The method of claim 1, wherein the act of generating at least one random bit includes an act of generating a plurality of random bits having sub-LSB bit weights.

4. The method of claim 3, wherein the act of generating a plurality of random bits includes an act of generating a first random bit having at least a resolution of ½ LSB and a second random bit having a resolution of at least ¼ LSB.

5. The method of claim 3, wherein the act of randomly generating a plurality of random bits includes an act of generating a first random bit having a resolution of at least ⅛ LSB and a second random bit having a resolution of at least ¹⁄₁₆ LSB.

6. The method of claim 1, wherein the act of generating a plurality of digital output bits includes an act of generating at least one digital output bit having a sub-LSB bit weight.

7. The method of claim 6, wherein the act of generating at least one digital output bit having a sub-LSB bit weight includes generating at least a first digital output bit having a resolution of at least ½ LSB and at least a second digital output bit having a resolution of at least ¼ LSB.

8. The method of claim 7, wherein the act of generating at least one random bit includes an act of generating a plurality of random bits including at least a first random bit having a resolution of at least ⅛ LSB and a second random bit having a resolution of at least ¹⁄₁₆ LSB.

9. The method of claim 1, wherein the act of generating at least one random bit includes shifting the at least one random bit from a linear feedback shift register (LFSR).

10. The method of claim 9, wherein the act of shifting at least one random bit from a linear feedback shift register includes an act of shifting the at least one random bit from an LFSR configured to produce a maximal length sequence.

11. An analog-to-digital converter (ADC) for providing a digital output signal indicative of an analog input signal, the ADC comprising:

a plurality of stages arranged in a pipeline, each of the plurality of stages providing at least one bit from samples of the analog input signal to form a plurality of digital output bits, at least one of the plurality of digital output bits having an LSB bit weight;

a random bit generator adapted to generate at least one random bit having a sub-LSB bit weight;

at least one register adapted to store a plurality of calibration bits, at least one of the plurality of calibration bits having a sub-LSB bit weight; and a correction component arranged to receive at least some of the plurality of digital output bits, the plurality of calibration bits and the at least one random bit, the correction component configured to modify the plurality of digital output bits according to the calibration bits and the at least one random bit to form the digital output signal.

12. The ADC of claim 6, wherein at least one of the plurality of stages provides at least one bit having a sub-LSB bit weight.

13. The ADC of claim 12, wherein the plurality of digital output bits provided by the plurality of stages include a first bit having a bit weight of ½ LSB and a second bit having a bit weight of ¼ LSB.

14. The ADC of claim 13, wherein the random number generator is adapted to generate a plurality of random bits including a first random bit having a bit weight of ⅛ LSB and a second random bit having a bit weight of ¹⁄₁₆ LSB.

15. The ADC of claim 11, wherein the random number generator is adapted to generate a plurality of random bits including a first random bit having a resolution of at least ½ LSB and a second random bit having a resolution of at least ¼ LSB.

16. The ADC of claim 11, wherein the random number generator is adapted to generate a plurality of random bits including a first random bit having a resolution of at least ⅛LSB and a second random bit having a resolution of at least ¹⁄₁₆ LSB.

17. The ADC of claim 11, wherein the random number generator includes a linear feedback shift register (LFSR).

18. The ADC of claim 17, wherein the LFSR is configured to generate maximal length sequences.

19. A digital signal generated by a pipeline ADC and representing samples of an analog input signal, the digital signal comprising:

M bits having associated bit weights $2^{M-1}$ through $2^0$, respectively, wherein a value of at least a bit having associated bit weight $2^0$ is determined by adding together digital output bits provided by the pipeline, a plurality of calibration bits having at least one bit with a sub-LSB bit weight, and at least one random bit having a sub-LSB bit weight.

* * * * *